(12) United States Patent
Miura et al.

(10) Patent No.: US 6,563,163 B1
(45) Date of Patent: May 13, 2003

(54) NONVOLATILE MEMORY USING DEEP LEVEL CAPTURE OF CARRIER AT CORNER STRUCTURE OF OXIDE FILM

(75) Inventors: Michiko Miura, Higashi-Hiroshima (JP); Tsuyoshi Ono, Higashi-Hiroshima (JP); Hans Jürgen Mattausch, Higashi-Hiroshima (JP)

(73) Assignee: Hiroshima University, Higashi-Hiroshima ( * ) Notice: Subject to any disclaimer, the term of this patent is extended or adjusted under 35 U.S.C. 154(b) by 0 days.

(21) Appl. No.: 09/572,239

(22) Filed: May 17, 2000

(30) Foreign Application Priority Data

May 18, 1999  (JP) .......................... 11-136710

(51) Int. Cl.⁷ ............................................. H01L 29/76
(52) U.S. Cl. ........................................ 257/314; 257/325
(58) Field of Search ............................ 257/314, 315, 257/316, 321, 325, 405

(56) References Cited

U.S. PATENT DOCUMENTS

| | | | |
|---|---|---|---|
| 4,672,577 A | | 6/1987 | Hirose et al. |
| 5,274,588 A | * | 12/1993 | Manzur et al. ............. 257/314 |
| 5,278,440 A | | 1/1994 | Shimoji |
| 5,519,653 A | * | 5/1996 | Thomas ....................... 257/317 |
| 5,621,683 A | * | 4/1997 | Young ..................... 365/185.05 |
| 5,753,951 A | * | 5/1998 | Geissler ...................... 257/316 |

FOREIGN PATENT DOCUMENTS

| | | | |
|---|---|---|---|
| JP | 47-26937 | | 10/1972 |
| JP | 53070682 | | 6/1978 |
| JP | 55-34432 A | | 3/1980 |
| JP | 61003450 A | | 1/1986 |
| JP | 363248176 A | * | 10/1988 |
| JP | 1-18268 A | | 1/1989 |
| JP | 3100991 A | | 4/1991 |
| JP | 07115142 A | | 5/1995 |
| WO | WO 92/02885 A1 | | 2/1992 |

OTHER PUBLICATIONS

Mattausch H.J. et al.; *Localized highly stable electrical passivation of the thermal oxide on nonplanar polycrystallines silicon;* Applied Physics Letters, Dec. 8, 1997; vol. 71, No. 23, pp. 3391–3393, XP–002189683; ISSN: 0003–6951.
Shiy. et al.; *Characteristics of Narrow Channel MOSFET Memory Based on Silicon Nanocrystals;* Japanese Journal of Applied Physics, Publication Office Japanese Journal of Applied Physics, Tokyo, Japan; vol. 38, No. 4B, Apr. 1999, pp. 2453–2456; XP–000923644 ISSN: 0021–4922.

* cited by examiner

Primary Examiner—Wael Fahmy
Assistant Examiner—Hoai Pham
(74) Attorney, Agent, or Firm—Alston & Bird LLP

(57) ABSTRACT

In a first surface of a semiconductor substrate, there is formed a step by etching. In the first surface of the substrate, there are also formed source and drain junction regions on respective sides of the step, and source and drain electrodes are formed on the source and drain regions, respectively. An oxide film having a thickness not larger than 10 nm is formed on the first surface of the substrate such that a corner structure corresponding to the step is formed in the oxide film. A gate is formed on the oxide film, a gate electrode is formed on the gate, and a substrate electrode is formed on a second surface of the substrate. Information is stored in the memory by a deep level capture of carriers injected and contained in the oxide film at the corner structure.

5 Claims, 2 Drawing Sheets

NONVOLATILE MEMORY USING DEEP LEVEL CAPTURE OF CARRIER AT CORNER STRUCTURE OF OXIDE FILM

BACKGROUND OF THE INVENTION

1. Field of the Invention

The present invention relates to a nonvolatile memory using a semiconductor device.

2. Related Art Statement

Among memory devices using semiconductor devices, a memory device in which stored data is maintained without performing any special maintaining operation is called a nonvolatile memory.

A nonvolatile memory using a Metal-Oxide-Semiconductor Field-Effect-Transistor (MOSFET) has become much more important in accordance with a progress of the information-oriented society.

FIG. 1 is a cross sectional view showing a known floating gate type nonvolatile memory which has been used widely at present. A tunnel oxide film 106 is provided on a semiconductor substrate 101 in a surface of which are formed junction regions 102 and 103 for source electrode 104 and drain electrode 105, respectively, and a floating gate 107 made of a conductive polysilicon is formed on the tunnel oxide film 106. On the floating gate 107, an oxide film 108 and a control gate 109 are formed successively.

A substrate electrode 111 is provided to be connected to a rear surface of the semiconductor substrate 101, and a gate electrode 110 is formed to be connected to the control gate 109.

A voltage is applied across the substrate electrode 111 and the gate electrode 110 or across the substrate electrode 111 and the drain electrode 105 to inject carriers into the floating gate 107 through the tunnel oxide film 106 and the thus injected carriers are contained by the oxide film 108 between the control gate 109 and the floating gate 107.

When carriers are contained in the floating gate 107, a threshold voltage for a drain current assumes a first value, and when no carrier is contained, the threshold voltage assumed a second value which is different from said first value. In this manner, the memory device has two conditions in its characteristics. Then, information data can be stored memorized as these two conditions.

In the floating gate type nonvolatile memory explained above, it is important that carriers could be injected into the floating gate efficiently and the once injected carriers could be retained in the floating gate. By reducing a thickness of the tunnel oxide film 106, it is possible to raise the carrier injection efficiency, and the device property can be improved. However, this causes the deterioration of the tunnel oxide film, and the proper operation of the memory circuit might be lost. Therefore, a thickness of the tunnel oxide film could not be reduced beyond a certain limit in order to attain a reliability of the tunnel oxide film, and as a result, the operating voltage must be high for injecting a sufficient amount of carriers.

In order to retain the injected carriers, it is required that the oxide film 108 between the control gate 109 and the floating gate 107 has a certain thickness. It is apparent that the thick oxide film 108 might reduce the efficiency of the carrier injection into the floating gate 107 from the tunneling oxide film 106. In order to increase the carrier injection efficiency even increasing a thickness of the oxide film 108, it has been proposed to make a difference in a surface area between the control gate 109 and the floating gate 107. However, this solution make a structure of the memory device and a miniaturization of the memory device could not be attained.

SUMMARY OF THE INVENTION

Therefore, it is an object of the invention to provide a nonvolatile memory having a novel structure in which an operation voltage can be lowered, and miniaturization of the memory device can be realized easily.

According to the invention, a nonvolatile memory comprises a semiconductor substrate having at least one step formed in a first surface thereof; source and drain junction regions formed in the first surface of the semiconductor substrate on respective sides of said step; source and drain electrodes formed on said source and drain junction regions, respectively; an oxide film formed on the first of the semiconductor substrate to have a corner structure corresponding to said step of the semiconductor substrate; and a gate provided on said oxide film such that information is stored in the memory in accordance with a change in a threshold voltage due to carriers electrically injected into said gate film and captured therein.

As mentioned in H. J. Mattausch et al., Appl. Phys. Lett., vol. 71, p. 3391 (1997), it has been known that a stable carrier capturing is performed at the corner structure in comparison with the plane part. Such a phenomenon is called a deep level capture. This deep level capture is very stable, and even if a heating treatment at a higher temperature is performed, the capture of carriers at the corner structure is stable.

In the nonvolatile memory according to the invention, carriers are injected into the oxide film by an application of an electric field across the semiconductor substrate and the gate or across the gate and the drain. Though a part of the injected carriers flows into the gate electrode, a remaining part of the injected carriers is captured in the oxide film stably to change a threshold voltage for the drain current.

In the known floating gate type nonvolatile memory, carriers are injected into the floating gate through the tunnel oxide film and are contained therein. Contrary to this, in the memory according to the invention, carriers are captured in the oxide film. Therefore, the memory can be operated at a lower voltage than the conventional floating gate type nonvolatile memory.

Furthermore, according to the invention, it is no more necessary to provide the oxide film for containing carriers, and thus the memory has a very simple structure. Therefore, the manufacturing cost of the nonvolatile memory according to the invention can be reduced greatly.

An optimum operating voltage of the nonvolatile memory according to this invention is determined by a thickness of the oxide film. In other words, a thickness of the oxide film can be determined by a desired operating voltage. It should be noted that when the oxide film is thinner than 10 nm, the deep level capture of carriers is decreased abruptly. Therefore, it is preferable that a thickness of the oxide film should not be less than 10 nm.

In an embodiment of the nonvolatile memory according to the invention, a thickness of the oxide film is not less than 10 nm.

As mentioned above, in the conventional floating gate type nonvolatile memory, the tunnel oxide file must be made thin in order to improve the device property. In the nonvolatile memory according to the invention, since carriers are captured in the oxide film, if the oxide film is too thin, carriers could not be effectively captured by the oxide film and the memory device could not work satisfactorily. Therefore, the nonvolatile memory according to the invention can be manufactured easily, precisely and reliably by means of the well developed manufacturing technology, and the manufacturing cost can be reduced.

In the memory according to the invention, the drain junction region is formed to extend under the oxide film. In this case, a distance from the corner to an inner edge of the drain junction region is determined in accordance with a channel length and a desired property of MOSFET. Particularly, it is preferred to extend the drain junction region under the oxide film such that the inner edge of this region is apart from the corner not less than 0.1 $\mu$m.

EXPLANATION OF THE PREFERRED EMBODIMENTS

Figure 1:
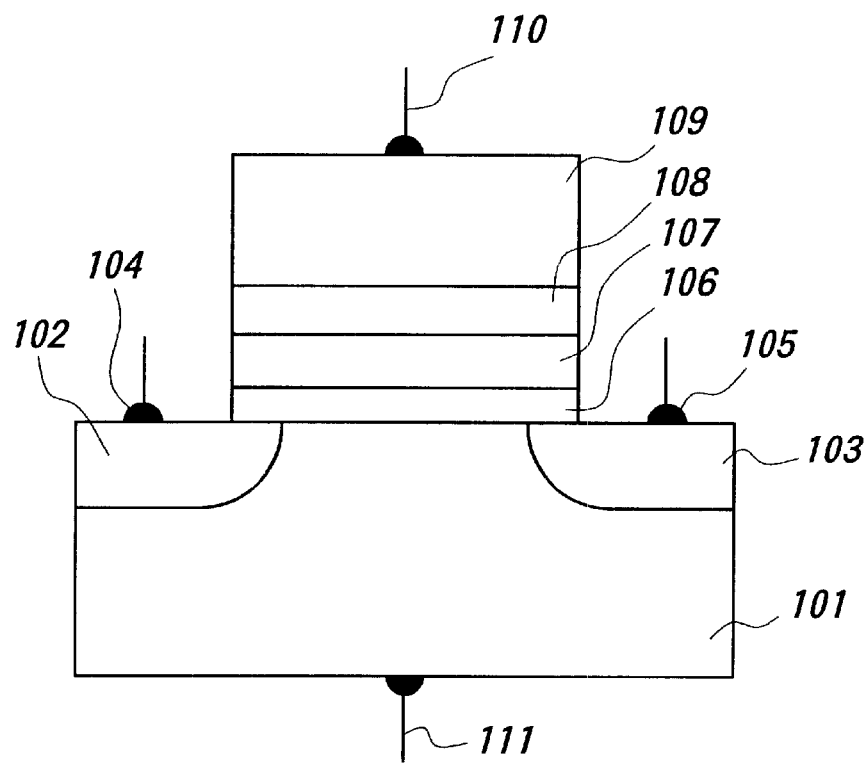
FIG. 1 is a cross sectional view showing a known floating gate type nonvolatile memory.
Figure 2:
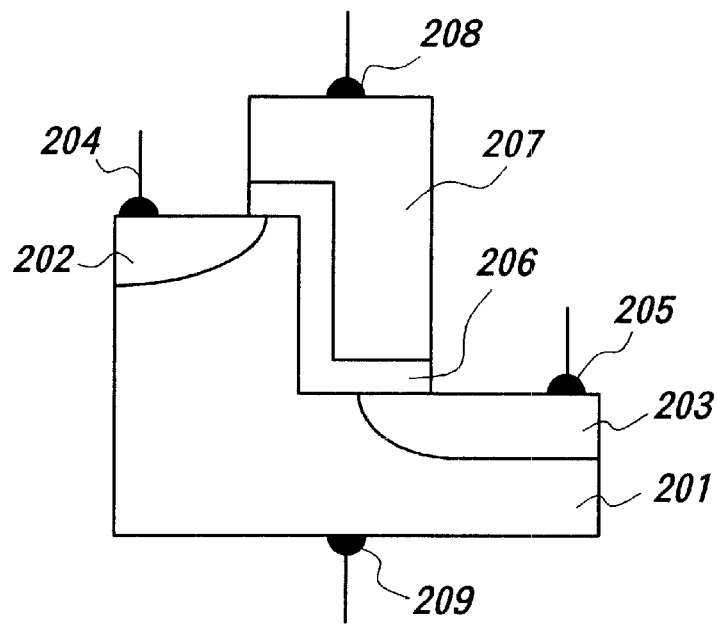
FIG. 2 is a cross sectional view illustrating an embodiment of the nonvolatile memory according to the invention.

FIG. 2 is a cross sectional view showing an embodiment of the nonvolatile memory according to the invention. A substrate 201 made of silicon or polysilicon has a step formed in a first surface thereof. Such a step can be easily and precisely formed by the conventional etching process. In the first surface of the substrate 201, there are formed a source junction region 202 and a drain junction region 203 on respective sides of the step, and a source electrode 204 and a drain electrode 205 are formed to be connected to these junction regions 202 and 203, respectively. On the first surface of the substrate 201, there is formed a oxide film 206 such that the step is covered with the oxide film 206, and a gate 207 is formed on the oxide film 206. In this manner, the MOSFET structure is formed. A gate electrode 208 is formed on the gate 207 and a substrate electrode 209 is formed on a second surface of the substrate 201.

According to the invention, it is important that the oxide film 206 has a corner structure corresponding to the step formed in the first surface of the substrate 201, because the oxide film 206 is formed along the step of the substrate 201.

When a voltage is applied across the substrate electrode 209 and the gate electrode 208 or across the drain electrode 205 and the gate electrode 208, carriers are injected from the drain junction region 203 or the substrate 201 into the oxide film 206 by a tunnel current due to an electric field. In this case, the carriers can be captured in the oxide film 206 efficiently by adjusting the applied voltage.

As stated above, the carriers captured at the corner structure of the oxide film 206 could be hardly released and are kept to be captured even if the heating treatment at a relatively high temperature is performed. A threshold voltage of MOSFET under a condition that carriers are captured in the oxide film 206 becomes different from a threshold value under a condition that carries are not captured. Such a change in the threshold voltage can store information in the memory according to the invention just like as the conventional floating gate type nonvolatile memory as a change in this threshold voltage.

An optimum operating voltage of the nonvolatile memory according to the invention can be determined by a thickness of the oxide film 206. This means that a thickness of the oxide film 206 can be determined in accordance with a desired operating voltage. In this case, it is preferable that a thickness of the oxide film is not less than 10 nm, because the deep level capture of carriers is decreased abruptly when a thickness of the oxide film is less than 10 nm.

The drain junction region 203 is formed such that it extends under the oxide film 206 to some extent. This is determined in accordance with a channel length and a required property of MOSFET. It should be noted that the inner end of the drain junction region 203 should be retained from the corner edge by at least 0.1 $\mu$m.

In the nonvolatile memory according to the invention, the deep level capture is realized by providing the corner structure in the oxide film, and it is preferable to form more than one corner structure. That is to say, a rate of the corner structure to a whole surface area of the substrate can be increased by forming a much more complicated corner structure. Then, a large shift in the threshold voltage may be realized without increasing a surface area of the memory.

Figure 3:
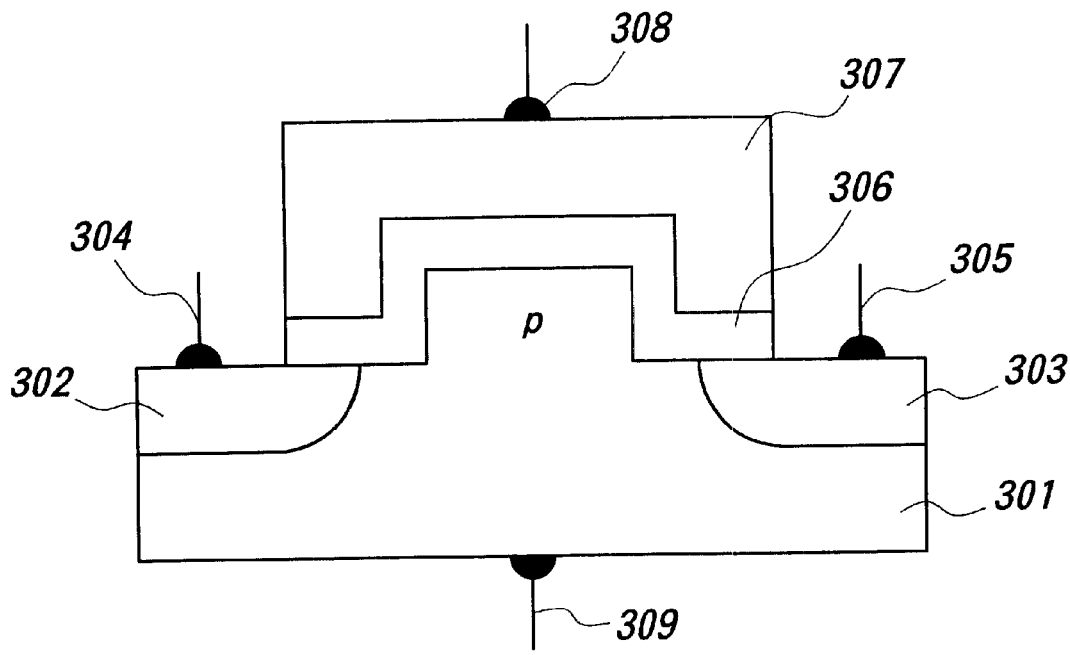
FIG. 3 is a cross sectional view depicting another embodiment of the nonvolatile memory according to the present invention.

FIG. 3 is the cross sectional view illustrating another embodiment of the nonvolatile memory according to the invention. A basic structure of the memory of the present embodiment is identical with that of the nonvolatile memory shown in FIG. 2. A substrate 301, a source junction region 302, a drain junction region 303, a source electrode 304, a drain electrode 305, a gate electrode 308, a substrate electrode 309, a oxide film 306 and a gate 307 have the same role as the corresponding components of the nonvolatile memory of FIG. 2.

In the present embodiment, a protrusion P is formed in the first surface of the substrate 301 by etching to provide two steps, and therefore the oxide film 306 deposited on the substrate 301 has also two corner structures. When it is assumed that a surface area of the substrate 301 of the present embodiment is identical with that of the nonvolatile memory shown in FIG. 2, it is possible to attain a larger shift in the threshold voltage. This is very convenient for miniaturization of the memory.

Moreover, the corner structure of the oxide film may be formed by utilizing an inactive part of adjacent element and the memory having a large threshold voltage may be obtained without increasing a surface area.

Figure 4:
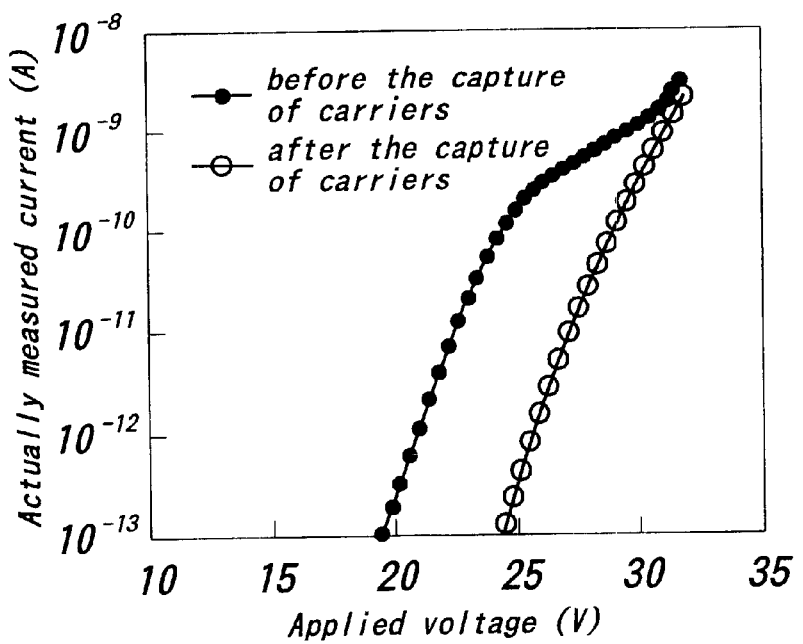
FIG. 4 is a graph representing a change in a gate current before and after the carrier capture.

FIG. 4 is a graph representing a shift in the threshold voltage. In this graph, a horizontal axis denotes the applied voltage and a vertical axis represents an actually measured current flowing into the gate. Black dots show the condition before the capture of carriers in the oxide film, and white dots express the condition after the capture of carriers. The oxide film has a thickness of 50 nm. It is understood from the graph that a very large shift in the threshold voltage can be attained before and after the capture of carriers.

As explained above, in the nonvolatile memory according to the invention having a novel structure, the operating voltage can be lowered and the miniaturization can be easily attained.

What is claimed is:

1. A nonvolatile memory comprising:
   a semiconductor substrate having at least one step formed in a first surface thereof;
   source and drain junction regions formed in the first surface of the semiconductor substrate on respective sides of said step;

source and drain electrodes formed on said source and drain junction regions, respectively;

an oxide film formed on the first surface of the semiconductor substrate to have a corner structure corresponding to said step of the semiconductor substrate; and a gate provided on said oxide film such that information is stored in the memory in accordance with a change in a threshold voltage due to carriers electrically injected into said oxide film and captured therein.

2. A memory according to claim 1, wherein a single step is formed in the first surface of the substrate to provide a single corner structure.

3. A memory according to claim 1, wherein a protrusion is formed in the first surface of the substrate to provided two corner structures.

4. A memory according to claim 1, wherein said oxide film has a thickness not less than 10 nm.

5. A memory according to claim 1, wherein said drain junction region is formed to extend under the oxide film such that an inner edge of the drain junction region is apart from the corner structure by not less than 0.1 $\mu$m.

* * * * *